(12) United States Patent
Chiu et al.

(10) Patent No.: US 8,378,466 B2
(45) Date of Patent: Feb. 19, 2013

(54) WAFER-LEVEL SEMICONDUCTOR DEVICE PACKAGES WITH ELECTROMAGNETIC INTERFERENCE SHIELDING

(75) Inventors: Chi-Tsung Chiu, Kaohsiung (TW); Kuo-Hsien Liao, Taichung (TW); Wei-Chi Yih, Taichung (TW); Yu-Chi Chen, Xuejia Township, Tainan County (TW); Chen-Chuan Fan, Dali (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 387 days.

(21) Appl. No.: 12/622,393

(22) Filed: Nov. 19, 2009

(65) Prior Publication Data
US 2011/0115060 A1    May 19, 2011

(51) Int. Cl.
H01L 23/552 (2006.01)
H01L 39/00 (2006.01)
H01L 23/58 (2006.01)
H01L 23/62 (2006.01)

(52) U.S. Cl. ........ 257/660; 257/659; 257/664; 257/662; 257/508

(58) Field of Classification Search .................. 257/660, 257/659, 692, 698, 662, 664, 508, 690, 708
See application file for complete search history.

(56) References Cited

U.S. PATENT DOCUMENTS

| | | | |
|---|---|---|---|
| 3,390,226 A | 6/1968 | Beyerlein | |
| 3,959,874 A | 6/1976 | Coucoulas | |
| 4,569,786 A | 2/1986 | Deguchi | |
| 4,717,948 A | 1/1988 | Sakai et al. | |
| 4,783,695 A | 11/1988 | Eichelberger et al. | |
| 4,814,205 A | 3/1989 | Arcilesi et al. | |
| 4,821,007 A | 4/1989 | Fields et al. | |
| 5,019,535 A | 5/1991 | Wojnarowski et al. | |
| 5,091,769 A | 2/1992 | Eichelberger | |
| 5,111,278 A | 5/1992 | Eichelberger | |
| 5,120,678 A | 6/1992 | Moore et al. | |

(Continued)

FOREIGN PATENT DOCUMENTS

| CN | 1442033 A | 9/2003 |
|---|---|---|
| CN | 1774804 A | 5/2006 |

(Continued)

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".

(Continued)

Primary Examiner — Chuong A. Luu
(74) Attorney, Agent, or Firm — Foley & Lardner LLP

(57) ABSTRACT

Described herein are wafer-level semiconductor device packages with EMI shielding and related methods. In one embodiment, a semiconductor device package includes: (1) a semiconductor device; (2) a package body covering lateral surfaces of the semiconductor device, a lower surface of the package body and a lower surface of the semiconductor device defining a front surface; (3) a set of redistribution layers disposed adjacent to the front surface, the set of redistribution layers including a grounding element that includes a connection surface electrically exposed adjacent to at least one lateral surface of the set of redistribution layers; and (4) an EMI shield disposed adjacent to the package body and electrically connected to the connection surface of the grounding element. The grounding element provides an electrical pathway to ground electromagnetic emissions incident upon the EMI shield.

25 Claims, 7 Drawing Sheets

U.S. PATENT DOCUMENTS

| | | | |
|---|---|---|---|
| 5,140,745 A | 8/1992 | McKenzie | |
| 5,149,662 A | 9/1992 | Eichelberger | |
| 5,151,776 A | 9/1992 | Wojnarowski et al. | |
| 5,157,589 A | 10/1992 | Cole, Jr. et al. | |
| 5,166,772 A | 11/1992 | Soldner et al. | |
| 5,172,077 A | 12/1992 | Funada | |
| 5,225,023 A | 7/1993 | Wojnarowski et al. | |
| 5,241,456 A | 8/1993 | Marcinkiewicz et al. | |
| 5,250,843 A | 10/1993 | Eichelberger | |
| 5,315,486 A | 5/1994 | Fillion et al. | |
| 5,324,687 A | 6/1994 | Wojnarowski | |
| 5,353,195 A | 10/1994 | Fillion et al. | |
| 5,353,498 A | 10/1994 | Fillion et al. | |
| 5,355,016 A | 10/1994 | Swirbel et al. | |
| 5,422,513 A | 6/1995 | Marcinkiewicz et al. | |
| 5,519,936 A | 5/1996 | Andros et al. | |
| 5,527,741 A | 6/1996 | Cole et al. | |
| 5,546,654 A | 8/1996 | Wojnarowski et al. | |
| 5,554,887 A | 9/1996 | Sawai et al. | |
| 5,557,142 A | 9/1996 | Gilmore et al. | |
| 5,567,656 A | 10/1996 | Chun | |
| 5,600,181 A | 2/1997 | Scott et al. | |
| 5,639,989 A | 6/1997 | Higgins, III | |
| 5,677,511 A | 10/1997 | Taylor et al. | |
| 5,694,300 A | 12/1997 | Mattei et al. | |
| 5,703,400 A | 12/1997 | Wojnarowski et al. | |
| 5,703,761 A | 12/1997 | Heiss | |
| 5,710,062 A | 1/1998 | Sawai et al. | |
| 5,726,612 A | 3/1998 | Mandai | |
| 5,729,437 A | 3/1998 | Hashimoto | |
| 5,745,984 A | 5/1998 | Cole, Jr. et al. | |
| 5,776,798 A | 7/1998 | Quan et al. | |
| 5,834,340 A | 11/1998 | Sawai et al. | |
| 5,841,193 A | 11/1998 | Eichelberger | |
| 5,847,930 A | 12/1998 | Kazle | |
| 5,864,088 A | 1/1999 | Sato et al. | |
| 5,866,952 A | 2/1999 | Wojnarowski et al. | |
| 5,886,876 A | 3/1999 | Yamaguchi | |
| 5,895,229 A | 4/1999 | Carney et al. | |
| 5,898,344 A | 4/1999 | Hayashi | |
| 5,966,052 A | 10/1999 | Sakai | |
| 5,977,626 A | 11/1999 | Wang et al. | |
| 5,998,867 A | 12/1999 | Jensen et al. | |
| 6,046,071 A | 4/2000 | Sawai et al. | |
| 6,079,099 A | 6/2000 | Uchida et al. | |
| 6,080,932 A | 6/2000 | Smith et al. | |
| 6,093,972 A | 7/2000 | Carney et al. | |
| 6,150,193 A * | 11/2000 | Glenn | 438/113 |
| 6,159,767 A | 12/2000 | Eichelberger | |
| 6,194,250 B1 | 2/2001 | Melton et al. | |
| 6,225,694 B1 | 5/2001 | Terui | |
| 6,232,151 B1 | 5/2001 | Ozmat et al. | |
| 6,239,482 B1 | 5/2001 | Fillion et al. | |
| 6,255,143 B1 | 7/2001 | Briar | |
| 6,261,680 B1 | 7/2001 | Denman | |
| 6,265,765 B1 | 7/2001 | DiStefano et al. | |
| 6,294,741 B1 | 9/2001 | Cole, Jr. et al. | |
| 6,306,680 B1 | 10/2001 | Fillion et al. | |
| 6,358,780 B1 | 3/2002 | Smith et al. | |
| 6,369,335 B1 | 4/2002 | Wajima | |
| 6,376,769 B1 | 4/2002 | Chung | |
| 6,377,461 B1 | 4/2002 | Ozmat et al. | |
| 6,396,148 B1 | 5/2002 | Eichelberger et al. | |
| 6,426,545 B1 | 7/2002 | Eichelberger et al. | |
| 6,448,632 B1 | 9/2002 | Takiar et al. | |
| 6,455,864 B1 | 9/2002 | Featherby et al. | |
| 6,472,598 B1 | 10/2002 | Glenn | |
| 6,472,743 B2 | 10/2002 | Huang et al. | |
| 6,479,903 B2 | 11/2002 | Briar | |
| 6,486,006 B2 | 11/2002 | Hirano et al. | |
| 6,492,194 B1 | 12/2002 | Bereau et al. | |
| 6,521,978 B2 | 2/2003 | Fenk et al. | |
| 6,555,908 B1 | 4/2003 | Eichelberger | |
| 6,566,596 B1 | 5/2003 | Askew | |
| 6,586,822 B1 | 7/2003 | Vu et al. | |
| 6,602,737 B2 | 8/2003 | Wu | |
| 6,614,102 B1 | 9/2003 | Hoffman et al. | |
| 6,635,953 B2 | 10/2003 | Wu | |
| 6,680,529 B2 | 1/2004 | Chen et al. | |
| 6,686,649 B1 | 2/2004 | Mathews et al. | |
| 6,695,985 B2 | 2/2004 | Igarashi et al. | |
| 6,701,614 B2 | 3/2004 | Ding et al. | |
| 6,740,546 B2 | 5/2004 | Corisis et al. | |
| 6,740,959 B2 | 5/2004 | Alcoe et al. | |
| 6,757,181 B1 | 6/2004 | Villanueva | |
| 6,781,231 B2 | 8/2004 | Minervini | |
| 6,800,804 B2 | 10/2004 | Igarashi et al. | |
| 6,818,544 B2 | 11/2004 | Eichelberger et al. | |
| 6,838,776 B2 | 1/2005 | Leal et al. | |
| 6,845,554 B2 | 1/2005 | Frankowsky et al. | |
| 6,856,007 B2 | 2/2005 | Warner | |
| 6,865,084 B2 | 3/2005 | Lin et al. | |
| 6,867,480 B2 | 3/2005 | Legaspi, Jr., et al. | |
| 6,881,896 B2 | 4/2005 | Ebihara | |
| 6,900,383 B2 | 5/2005 | Babb et al. | |
| 6,921,683 B2 | 7/2005 | Nakayama | |
| 6,921,975 B2 | 7/2005 | Leal et al. | |
| 6,928,719 B2 | 8/2005 | Kim et al. | |
| 6,953,708 B2 | 10/2005 | Hedler et al. | |
| 6,962,869 B1 | 11/2005 | Bao et al. | |
| 6,967,403 B2 | 11/2005 | Chuang et al. | |
| 6,975,516 B2 | 12/2005 | Asahi et al. | |
| 6,992,400 B2 | 1/2006 | Tikka et al. | |
| 6,998,532 B2 | 2/2006 | Kawamoto et al. | |
| 7,012,323 B2 | 3/2006 | Warner et al. | |
| 7,015,075 B2 | 3/2006 | Fay et al. | |
| 7,030,469 B2 | 4/2006 | Mahadevan et al. | |
| 7,045,385 B2 | 5/2006 | Kim et al. | |
| 7,045,908 B2 | 5/2006 | Ohsumi | |
| 7,048,450 B2 | 5/2006 | Beer et al. | |
| 7,049,682 B1 | 5/2006 | Mathews et al. | |
| 7,081,661 B2 | 7/2006 | Takehara et al. | |
| 7,087,991 B2 | 8/2006 | Chen et al. | |
| 7,091,595 B2 | 8/2006 | Fuergut et al. | |
| 7,112,467 B2 | 9/2006 | Eichelberger et al. | |
| 7,125,744 B2 | 10/2006 | Takehara et al. | |
| 7,126,218 B1 | 10/2006 | Darveaux et al. | |
| 7,141,884 B2 | 11/2006 | Kojima et al. | |
| 7,145,228 B2 | 12/2006 | Yean et al. | |
| 7,161,252 B2 | 1/2007 | Tsuneoka et al. | |
| 7,163,843 B2 | 1/2007 | Kiendl et al. | |
| 7,180,012 B2 | 2/2007 | Tsuneoka et al. | |
| 7,183,498 B2 | 2/2007 | Ogura et al. | |
| 7,186,928 B2 | 3/2007 | Kikuchi et al. | |
| 7,187,060 B2 | 3/2007 | Usui | |
| 7,294,587 B2 | 11/2007 | Asahi et al. | |
| 7,294,791 B2 | 11/2007 | Danoski et al. | |
| 7,327,015 B2 | 2/2008 | Yang et al. | |
| 7,342,303 B1 | 3/2008 | Berry et al. | |
| 7,344,917 B2 | 3/2008 | Gautham | |
| 7,361,533 B1 | 4/2008 | Huemoeller et al. | |
| 7,361,987 B2 | 4/2008 | Leal et al. | |
| 7,364,944 B2 | 4/2008 | Huang et al. | |
| 7,371,617 B2 | 5/2008 | Tsai et al. | |
| 7,372,151 B1 | 5/2008 | Fan et al. | |
| 7,425,464 B2 | 9/2008 | Fay et al. | |
| 7,445,968 B2 | 11/2008 | Harrison et al. | |
| 7,446,265 B2 | 11/2008 | Krohto et al. | |
| 7,451,539 B2 | 11/2008 | Morris et al. | |
| 7,453,148 B2 | 11/2008 | Yang et al. | |
| 7,476,563 B2 | 1/2009 | Mangrum et al. | |
| 7,478,474 B2 | 1/2009 | Koga | |
| 7,482,198 B2 | 1/2009 | Bauer et al. | |
| 7,488,903 B2 | 2/2009 | Kawagishi et al. | |
| 7,501,310 B2 | 3/2009 | Yang et al. | |
| 7,511,365 B2 | 3/2009 | Wu et al. | |
| 7,514,767 B2 | 4/2009 | Yang | |
| 7,566,955 B2 | 7/2009 | Warner | |
| 7,575,173 B2 | 8/2009 | Fuergut et al. | |
| 7,576,415 B2 | 8/2009 | Cha et al. | |
| 7,588,951 B2 | 9/2009 | Mangrum et al. | |
| 7,595,226 B2 | 9/2009 | Lytle et al. | |
| 7,619,304 B2 | 11/2009 | Bauer et al. | |
| 7,619,901 B2 | 11/2009 | Eichelberger et al. | |
| 7,622,733 B2 | 11/2009 | Fuergut et al. | |
| 7,629,674 B1 | 12/2009 | Foster | |
| 7,633,170 B2 | 12/2009 | Yang et al. | |

| | | |
|---|---|---|
| 7,633,765 B1 | 12/2009 | Scanlan et al. |
| 7,643,311 B2 | 1/2010 | Coffy |
| 7,655,501 B2 | 2/2010 | Yang et al. |
| 7,656,047 B2 | 2/2010 | Yang et al. |
| 7,662,667 B2 | 2/2010 | Shen |
| 7,667,318 B2 | 2/2010 | Yang et al. |
| 7,675,157 B2 | 3/2010 | Liu et al. |
| 7,692,286 B1 | 4/2010 | Huemoeller et al. |
| 7,700,411 B2 | 4/2010 | Yang et al. |
| 7,714,431 B1 | 5/2010 | Huemoeller et al. |
| 7,727,803 B2 | 6/2010 | Yamagata |
| 7,732,242 B2 | 6/2010 | Brunnbauer et al. |
| 7,741,151 B2 | 6/2010 | Amrine et al. |
| 7,745,910 B1 | 6/2010 | Olson et al. |
| 7,759,163 B2 | 7/2010 | Kroeninger et al. |
| 7,763,976 B2 | 7/2010 | Tang et al. |
| 7,767,495 B2 | 8/2010 | Fuergut et al. |
| 7,772,046 B2 | 8/2010 | Pagaila et al. |
| 7,799,602 B2 * | 9/2010 | Pagaila et al. .................. 438/106 |
| 7,807,512 B2 | 10/2010 | Lee et al. |
| 7,812,434 B2 | 10/2010 | Yang |
| 7,829,981 B2 | 11/2010 | Hsu |
| 7,830,004 B2 | 11/2010 | Wu et al. |
| 7,834,464 B2 | 11/2010 | Meyer et al. |
| 7,932,599 B2 | 4/2011 | Kiendl et al. |
| 7,989,928 B2 | 8/2011 | Liao et al. |
| 8,018,040 B2 * | 9/2011 | Jang et al. ...................... 257/686 |
| 8,022,511 B2 | 9/2011 | Chiu et al. |
| 8,039,303 B2 | 10/2011 | Shim et al. |
| 8,039,304 B2 * | 10/2011 | Pagaila ......................... 438/107 |
| 2002/0053724 A1 | 5/2002 | Lai et al. |
| 2002/0093108 A1 | 7/2002 | Grigorov |
| 2003/0090883 A1 | 5/2003 | Asahi et al. |
| 2004/0012099 A1 | 1/2004 | Nakayama |
| 2004/0020673 A1 | 2/2004 | Mazurkiewicz |
| 2004/0063242 A1 | 4/2004 | Karnezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0208702 A1 | 9/2005 | Kim |
| 2006/0065387 A1 | 3/2006 | Tonapi et al. |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0231944 A1 | 10/2006 | Huang et al. |
| 2006/0266547 A1 | 11/2006 | Koga |
| 2007/0030661 A1 | 2/2007 | Morris |
| 2007/0222054 A1 | 9/2007 | Hembree |
| 2007/0241437 A1 | 10/2007 | Kagaya et al. |
| 2008/0042301 A1 | 2/2008 | Yang et al. |
| 2008/0061407 A1 | 3/2008 | Yang et al. |
| 2008/0128890 A1 | 6/2008 | Choi et al. |
| 2008/0137314 A1 | 6/2008 | Salama et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0075428 A1 | 3/2009 | Tang et al. |
| 2009/0101400 A1 | 4/2009 | Yamakoshi |
| 2009/0102003 A1 | 4/2009 | Vogt et al. |
| 2009/0102033 A1 | 4/2009 | Raben |
| 2009/0102066 A1 | 4/2009 | Lee et al. |
| 2009/0127686 A1 | 5/2009 | Yang et al. |
| 2009/0129037 A1 | 5/2009 | Yoshino |
| 2009/0152688 A1 | 6/2009 | Do et al. |
| 2009/0194851 A1 | 8/2009 | Chiu et al. |
| 2009/0194852 A1 | 8/2009 | Chiu et al. |
| 2009/0224391 A1 | 9/2009 | Lin et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236686 A1 | 9/2009 | Shim et al. |
| 2009/0236700 A1 | 9/2009 | Moriya |
| 2009/0256244 A1 | 10/2009 | Liao et al. |
| 2009/0261466 A1 | 10/2009 | Pagaila et al. |
| 2009/0261470 A1 | 10/2009 | Choi et al. |
| 2009/0294928 A1 | 12/2009 | Kim et al. |
| 2009/0302435 A1 | 12/2009 | Pagaila et al. |
| 2009/0302446 A1 | 12/2009 | Lee et al. |
| 2010/0006330 A1 | 1/2010 | Fu et al. |
| 2010/0006994 A1 | 1/2010 | Shim et al. |
| 2010/0013064 A1 | 1/2010 | Hsu |
| 2010/0032815 A1 | 2/2010 | An et al. |
| 2010/0072599 A1 | 3/2010 | Camacho et al. |
| 2010/0072618 A1 | 3/2010 | Camacho et al. |
| 2010/0084759 A1 | 4/2010 | Shen |
| 2010/0109132 A1 * | 5/2010 | Ko et al. ........................ 257/660 |
| 2010/0110656 A1 | 5/2010 | Ko et al. |
| 2010/0140759 A1 | 6/2010 | Pagaila et al. |
| 2010/0207257 A1 | 8/2010 | Lee |
| 2010/0207258 A1 | 8/2010 | Eun et al. |
| 2010/0207259 A1 | 8/2010 | Liao et al. |
| 2010/0214780 A1 | 8/2010 | Villard |
| 2010/0224983 A1 | 9/2010 | Huang et al. |
| 2010/0244208 A1 | 9/2010 | Pagaila et al. |
| 2010/0308449 A1 | 12/2010 | Yang et al. |
| 2010/0314746 A1 | 12/2010 | Hsieh et al. |
| 2010/0320585 A1 | 12/2010 | Jiang et al. |
| 2010/0320593 A1 | 12/2010 | Weng et al. |
| 2011/0006408 A1 | 1/2011 | Liao |
| 2011/0018118 A1 | 1/2011 | Hsieh et al. |
| 2011/0018124 A1 | 1/2011 | Yang et al. |
| 2011/0068453 A1 | 3/2011 | Cho et al. |
| 2011/0115059 A1 | 5/2011 | Lee et al. |
| 2011/0115066 A1 | 5/2011 | Kim |
| 2011/0127654 A1 | 6/2011 | Weng et al. |
| 2011/0140364 A1 | 6/2011 | Head |
| 2011/0169150 A1 | 7/2011 | Su et al. |
| 2011/0177654 A1 | 7/2011 | Lee et al. |
| 2011/0194265 A1 | 8/2011 | Su et al. |
| 2011/0227220 A1 | 9/2011 | Chen et al. |
| 2011/0241192 A1 | 10/2011 | Ding et al. |
| 2011/0241193 A1 | 10/2011 | Ding et al. |
| 2011/0241194 A1 | 10/2011 | Chen et al. |
| 2011/0278741 A1 | 11/2011 | Chua et al. |

FOREIGN PATENT DOCUMENTS

| | | |
|---|---|---|
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |
| JP | 08288686 | 11/1996 |
| JP | 2003273571 | 9/2003 |
| WO | WO 2004060034 | 7/2004 |
| WO | WO 2006076613 | 7/2006 |

OTHER PUBLICATIONS

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

* cited by examiner

WAFER-LEVEL SEMICONDUCTOR DEVICE PACKAGES WITH ELECTROMAGNETIC INTERFERENCE SHIELDING

FIELD OF THE INVENTION

The invention relates generally to semiconductor device packages. More particularly, the invention relates to wafer-level semiconductor device packages with electromagnetic interference shielding.

BACKGROUND

Semiconductor devices have become progressively more complex, driven at least in part by the demand for smaller sizes and enhanced processing speeds. While the benefits of smaller sizes and enhanced processing speeds are apparent, these characteristics of semiconductor devices also can create problems.

In conventional wafer-level packaging, semiconductor devices within a wafer are packaged prior to singulation of the wafer. As such, conventional wafer-level packaging can be restricted to a fan-in configuration, namely electrical contacts and other components of a resulting semiconductor device package are restricted to an area defined by a periphery of a semiconductor device. Any component disposed outside of the periphery of the semiconductor device typically is not supported and typically is removed upon singulation. The restriction of a fan-in configuration presents challenges as device sizes continue to shrink.

Also, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference ("EMI"). Smaller sizes of semiconductor devices can further exacerbate EMI by providing a higher density of those semiconductor devices within an overall electronic system, and, thus, a higher level of undesired electromagnetic emissions at a neighboring semiconductor device.

It is against this background that a need arose to develop the wafer-level semiconductor device packages and related methods described herein.

SUMMARY

One aspect of the invention relates to wafer-level semiconductor device packages with EMI shielding. In one embodiment, a semiconductor device package includes: (1) a semiconductor device including (a) a lower surface, (b) lateral surfaces disposed adjacent to a periphery of the semiconductor device, and (c) a contact pad disposed adjacent to the lower surface of the semiconductor device; (2) a package body covering the lateral surfaces of the semiconductor device, the package body including (a) an upper surface, (b) a lower surface, and (c) lateral surfaces disposed adjacent to a periphery of the package body, the lower surface of the package body and the lower surface of the semiconductor device defining a front surface; (3) a set of redistribution layers disposed adjacent to the front surface, the set of redistribution layers including (a) lateral surfaces disposed adjacent to a periphery of the set of redistribution layers and (b) a grounding element, the grounding element including a connection surface that is electrically exposed adjacent to at least one of the lateral surfaces of the set of redistribution layers; and (4) an EMI shield disposed adjacent to the upper surface of the package body and the lateral surfaces of the package body and electrically connected to the connection surface of the grounding element, wherein the grounding element provides an electrical pathway to ground electromagnetic emissions incident upon the EMI shield.

In another embodiment, the semiconductor device package includes: (1) a semiconductor device including an active surface; (2) a package body covering the semiconductor device such that the active surface of the semiconductor device is electrically exposed, the package body including exterior surfaces; (3) a redistribution unit including (a) a dielectric layer disposed adjacent to the active surface of the semiconductor device and defining openings that are aligned with the active surface of the semiconductor device, (b) an electrical trace extending along the dielectric layer and electrically connected to the active surface of the semiconductor device through one of the openings defined by the dielectric layer, and (c) a grounding element extending along the dielectric layer and including a lateral surface disposed adjacent to a periphery of the redistribution unit; and (4) an EMI shield disposed adjacent to the exterior surfaces of the package body and electrically connected to the lateral surface of the grounding element, wherein the grounding element provides an electrical pathway to ground electromagnetic emissions incident upon the EMI shield.

Another aspect of the invention relates to methods of forming wafer-level semiconductor device packages with EMI shielding. In one embodiment, a method includes: (1) providing a semiconductor device including an active surface; (2) applying a molding material to form a molded structure covering the semiconductor device with the active surface of the semiconductor device being at least partially exposed; (3) forming a redistribution structure adjacent to the active surface of the semiconductor device, the redistribution structure including an electrical interconnect extending laterally within the redistribution structure; (4) forming cutting slits extending through the molded structure and the redistribution structure, the cutting slits being aligned with the redistribution structure, such that: (a) the redistribution structure is sub-divided to form a redistribution unit; (b) the molded structure is sub-divided to form a package body including exterior surfaces; and (c) a remnant of the electrical interconnect corresponds to a grounding element including an exposed connection surface; and (5) applying an EMI coating to the exterior surfaces of the package body and the connection surface of the grounding element to form an EMI shield.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a grounding element can include multiple grounding elements unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1:
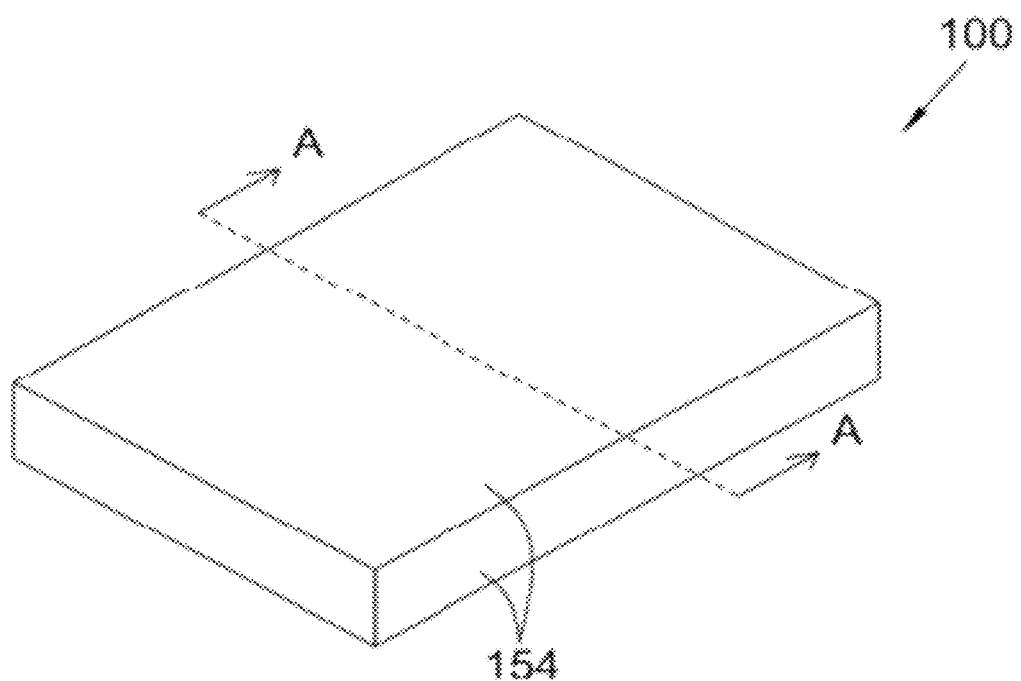
FIG. 1 illustrates a perspective view of a wafer-level semiconductor device package implemented in accordance with an embodiment of the invention.
Figure 2:
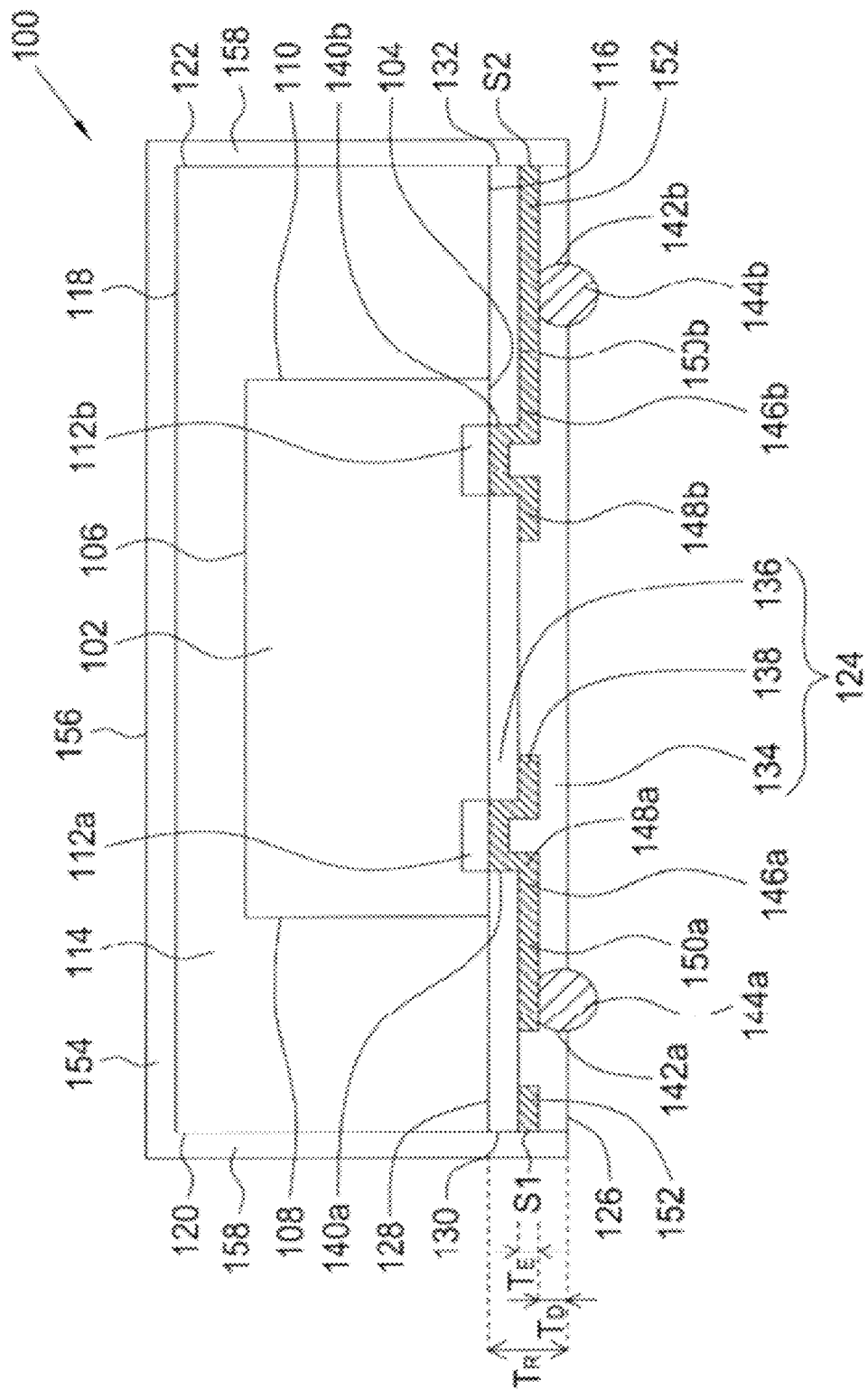
FIG. 2 illustrates a cross-sectional view of the package of FIG. 1, taken along line A-A of FIG. 1.

Attention first turns to FIG. 1 and FIG. 2, which illustrate a wafer-level semiconductor device package 100 implemented in accordance with an embodiment of the invention. In particular, FIG. 1 illustrates a perspective view of the package 100, while FIG. 2 illustrates a cross-sectional view of the package 100, taken along line A-A of FIG. 1.

In the illustrated embodiment, sides of the package 100 are substantially planar and have a substantially orthogonal orientation so as to define a lateral profile that extends around substantially an entire periphery of the package 100. Advantageously, this orthogonal lateral profile allows a reduced overall package size by reducing or minimizing a footprint area of the package 100. However, it is contemplated that the lateral profile of the package 100, in general, can be any of a number of shapes, such as curved, inclined, stepped, or roughly textured.

Referring to FIG. 2, the package 100 includes a semiconductor device 102, which includes a lower surface 104, an upper surface 106, and lateral surfaces 108 and 110 disposed adjacent to a periphery of the semiconductor device 102 and extending between the lower surface 104 and the upper surface 106. In the illustrated embodiment, each of the surfaces 104, 106, 108, and 110 is substantially planar, with the lateral surfaces 108 and 110 having a substantially orthogonal orientation with respect to the lower surface 104 or the upper surface 106, although it is contemplated that the shapes and orientations of the surfaces 104, 106, 108, and 110 can vary for other implementations. As illustrated in FIG. 2, the upper surface 106 is a back surface of the semiconductor device 102, while the lower surface 104 is an active surface of the semiconductor device 102 that has contact pads 112a and 112b disposed adjacent thereto. The contact pads 112a and 112b provide input and output electrical connections for the semiconductor device 102, and at least one of the contact pads 112a and 112b, namely the contact pad 112b, is a ground contact pad. In the illustrated embodiment, the semiconductor device 102 is a semiconductor chip, although it is contemplated that the semiconductor device 102, in general, can be any active device, any passive device, or a combination thereof. While one semiconductor device is illustrated in FIG. 2, it is contemplated that additional semiconductor devices can be included for other implementations.

As illustrated in FIG. 2, the package 100 also includes a package body 114 that is disposed adjacent to the semiconductor device 102. In conjunction with a redistribution unit 124 that is further described below, the package body 114 substantially covers or encapsulates the semiconductor device 102 to provide mechanical stability as well as protection against oxidation, humidity, and other environmental conditions. In the illustrated embodiment, the package body 114 substantially covers the upper surface 106 and the lateral surfaces 108 and 110 of the semiconductor device 102, with the lower surface 104 the semiconductor device 102 being substantially exposed or uncovered. However, it is contemplated that the extent of coverage by the package body 114 can be varied from that illustrated in FIG. 2. For example, it is contemplated that the package body 114 can substantially cover the lateral surfaces 108 and 110, while both the lower surface 104 and the upper surface 106 are substantially uncovered.

As illustrated in FIG. 2, the package body 114 is formed from a molding material, and includes a lower surface 116 and exterior surfaces, including an upper surface 118 and lateral surfaces 120 and 122 disposed adjacent to a periphery of the package body 114 and extending between the lower surface 116 and the upper surface 118. In the illustrated embodiment, each of the surfaces 116, 118, 120, and 122 is substantially planar, with the lateral surfaces 120 and 122 having a substantially orthogonal orientation with respect to the lower surface 116 or the upper surface 118, although it is contemplated that the shapes and orientations of the surfaces 116, 118, 120, and 122 can vary for other implementations. As illustrated in FIG. 2, the periphery of the package body 114, as defined by the lateral surfaces 120 and 122, has a greater lateral extent than the periphery of the semiconductor device 102, thereby allowing the package 100 to be implemented with a fan-out configuration, namely components of the package 100 can be disposed within as well as outside of an area defined by the periphery of the semiconductor device 102. Also, the lower surface 116 of the package body 114 is substantially aligned or co-planar with the lower surface 104 of the semiconductor device 102, thereby defining a front surface that is substantially planar. More particularly, this alignment is accomplished while allowing the lower surface 104 to be substantially exposed or uncovered, such as by reducing or minimizing coverage of the contact pads 112$a$ and 112$b$. For other implementations, it is contemplated that the alignment of the lower surfaces 104 and 116 can be varied from that illustrated in FIG. 2, while allowing the lower surface 104 to be at least partially electrically exposed to allow input and output electrical connections to the contact pads 112$a$ and 112$b$. It is also contemplated that the package body 114 can include a supporting structure in conjunction with, or in place of, a molding material. For example, the package body 114 can include a frame or an interposer, which can be formed from glass, silicon, a metal, a metal alloy, a polymer, or another suitable structural material.

Referring to FIG. 2, the package 100 also includes the redistribution unit 124, which is disposed adjacent to the front surface defined by the lower surfaces 104 and 116. The redistribution unit 124 is electrically connected to the semiconductor device 102, and provides electrical pathways as well as mechanical stability and protection against environmental conditions. As illustrated in FIG. 2, the redistribution unit 124 includes a lower surface 126, an upper surface 128, and lateral surfaces 130 and 132 disposed adjacent to a periphery of the redistribution unit 124 and extending between the lower surface 126 and the upper surface 128. In the illustrated embodiment, each of the surfaces 126, 128, 130, and 132 is substantially planar, with the lateral surfaces 130 and 132 having a substantially orthogonal orientation with respect to the lower surface 126 or the upper surface 128, although it is contemplated that the shapes and orientations of the surfaces 126, 128, 130, and 132 can vary for other implementations. The periphery of the redistribution unit 124, as defined by the lateral surfaces 130 and 132 and as supported by the package body 114, has a greater lateral extent than the periphery of the semiconductor device 102, thereby allowing the package 100 to be implemented with the fan-out configuration. Also, the lateral surfaces 130 and 132 of the redistribution unit 124 are substantially aligned or co-planar with the lateral surfaces 120 and 122 of the package body 114, respectively. More particularly, this alignment is accomplished while allowing the lateral surfaces 130 and 132 to be substantially exposed or uncovered, such as by reducing or minimizing coverage of the lateral surfaces 130 and 132. For other implementations, it is contemplated that the alignment of the lateral surfaces 120, 122, 130, and 132 can be varied from that illustrated in FIG. 2, while allowing the lateral surfaces 130 and 132 to be at least partially electrically exposed. For certain implementations, a thickness $T_R$ of the redistribution unit 124, namely a distance between the lower surface 126 and the upper surface 128 of the redistribution unit 124, can be in the range of about 10 micrometer ("μm") to about 50 μm, such as from about 12 μm to about 50 μm or from about 14 μm to about 42 μm.

Still referring to FIG. 2, the redistribution unit 124 is formed in situ during manufacturing as a set of redistribution layers, although it is contemplated that the redistribution unit 124 can include a preformed structure for other implementations. In the illustrated embodiment, the redistribution unit 124 is multi-layered and includes a pair of dielectric layers 134 and 136 and an electrically conductive layer 138 that is at least partially sandwiched by the dielectric layers 134 and 136. In general, each of the dielectric layers 134 and 136 can be formed from a dielectric material that is polymeric or non-polymeric. For example, at least one of the dielectric layers 134 and 136 can be formed from polyimide, polybenzoxazole, benzocyclobutene, or a combination thereof. The dielectric layers 134 and 136 can be formed from the same dielectric material or different dielectric materials. For certain implementations, at least one of the dielectric layers 134 and 136 can be formed from a dielectric material that is photoimageable or photoactive, thereby reducing manufacturing cost and time by allowing patterning using photolithography, and a thickness TD of each of the dielectric layers 134 and 136 can be in the range of about 1 μm to about 12 μm, such as from about 1 μm to about 10 μm or from about 2 μm to about 6 μm. While two dielectric layers are illustrated in FIG. 2, it is contemplated that more or less dielectric layers can be included for other implementations.

As illustrated in FIG. 2, the dielectric layer 136 is formed so as to define openings 140$a$ and 140$b$, which are aligned and sized so as to at least partially expose the contact pads 112$a$ and 112$b$, respectively, and the dielectric layer 134 is formed so as to define openings 142$a$ and 142$b$, which are aligned so as to at least partially expose the electrically conductive layer 138 and are sized so as to accommodate electrical contacts 144$a$ and 144$b$. The electrical contacts 144$a$ and 144$b$ provide input and output electrical connections for the package 100, and at least one of the electrical contacts 144$a$ and 144$b$ is electrically connected to the semiconductor device 102 through the electrically conductive layer 138. In the illustrated embodiment, the electrical contacts 144$a$ and 144$b$ are implemented as solder bumps, and at least one of the electrical contacts 144$a$ and 144$b$, namely the electrical contact 144$b$, is a ground electrical contact that is electrically connected to the ground contact pad 112$b$. In accordance with the fan-out configuration of the package 100, the electrical contacts 144$a$ and 144$b$ are laterally disposed outside of the periphery of the semiconductor device 102, although it is contemplated that the electrical contacts 144$a$ and 144$b$, in general, can be laterally disposed within that periphery, outside of that periphery, or both. In such manner, the fan-out configuration of the package 100 allows greater flexibility in terms of the arrangement and spacing of the electrical contacts 144$a$ and 144$b$, with reduced dependence upon the arrangement and spacing of the contact pads 112$a$ and 112$b$ of the semiconductor device 102.

The electrically conductive layer 138 serves as a redistribution network for the contact pads 112$a$ and 112$b$ of the semiconductor device 102, and, in accordance with the fan-out configuration of the package 100, the electrically conductive layer 138 extends laterally within the redistribution unit 124 and outside of the periphery of the semiconductor device 102. As illustrated in FIG. 2, the electrically conductive layer 138 includes an electrical interconnect 146a, which electrically connects the contact pad 112a to the electrical contact 144a, and an electrical interconnect 146b, which electrically connects the ground contact pad 112b to the ground electrical contact 144b. More particularly, each of the electrical interconnects 146a and 146b is formed so as to include one portion disposed within a respective one of the openings 140a and 140b, namely a via 148a or 148b that is electrically connected to the contact pad 112a or 112b, and another portion extending along a lower surface of the dielectric layer 136, namely an electrical trace 150a or 150b that is electrically connected to the electrical contact 144a or 144b. In general, each of the electrical interconnects 146a and 146b can be formed from a metal, a metal alloy, a matrix with a metal or a metal alloy dispersed therein, or another suitable electrically conductive material. For example, at least one of the electrical interconnects 146a and 146b can be formed from aluminum, copper, titanium, or a combination thereof. The electrical interconnects 146a and 146b can be formed from the same electrically conductive material or different electrically conductive materials. For certain implementations, a thickness $T_E$ of each of the electrical interconnects 146a and 146b can be in the range of about 1 μm to about 12 μm, such as from about 1 μm to about 10 μm or from about 2 μm to about 6 μm. While one electrically conductive layer is illustrated in FIG. 2, it is contemplated that additional electrically conductive layers can be included for other implementations.

In the illustrated embodiment, the electrical interconnect 146b also serves as a grounding element to reduce EMI, and is formed so as to include a grounding portion 152 disposed adjacent to the periphery of the redistribution unit 124. As illustrated in FIG. 2, the grounding portion 152 extends around at least a portion of the periphery of the redistribution unit 124 and, more particularly, is implemented as a grounding ring or a set of grounding strips in accordance with manufacturing operations as further described below. Referring to FIG. 2, the grounding portion 152 includes connection surfaces S1 and S2, which are lateral surfaces that face away from an interior of the package 100 and are disposed adjacent to the periphery of the redistribution unit 124. More particularly, the connection surfaces S1 and S2 are substantially exposed or uncovered at the periphery of the redistribution unit 124, and are electrically exposed adjacent to the lateral surfaces 130 and 132, respectively. By extending partially or fully around the periphery of the redistribution unit 124, the grounding portion 152 provides relatively large areas for the connection surfaces S1 and S2, which, in turn, provide enhanced reliability and efficiency of electrical connections for reducing EMI. However, it is contemplated that the extent of the grounding portion 152 around the periphery of the redistribution unit 124 can vary for other implementations. It is also contemplated that multiple, discrete grounding elements can be included, with the connection surfaces S1 and S2 corresponding to lateral surfaces of respective ones of the grounding elements.

As illustrated in FIG. 1 and FIG. 2, the package 100 further includes an EMI shield 154 that is disposed adjacent to the exterior surfaces of the package body 114, the connection surfaces S1 and S2 of the grounding portion 152, and the lateral surfaces 130 and 132 of the redistribution unit 124. The EMI shield 154 is formed from an electrically conductive material, and substantially surrounds the semiconductor device 102 within the package 100 to provide protection against EMI. In the illustrated embodiment, the EMI shield 154 includes an upper portion 156 and a lateral portion 158, which extends around substantially the entire periphery of the package body 114 and defines the orthogonal lateral profile of the package 100. As illustrated in FIG. 2, the lateral portion 158 extends downwardly from the upper portion 156 and along the lateral surfaces 130 and 132 of the redistribution unit 124, and includes a lower end that is substantially aligned or co-planar with the lower surface 126 of the redistribution unit 124. However, it is contemplated that the extent of the lateral portion 158 and the alignment of its lower end with the lower surface 126 can be varied for other implementations.

As illustrated in FIG. 2, the EMI shield 154 is electrically connected to the connection surfaces S1 and S2 of the grounding portion 152 of the electrical interconnect 146b. When electromagnetic emissions radiated from an interior of the package 100 strike the EMI shield 154, at least a portion of these emissions can be efficiently grounded via the electrical interconnect 146b, thereby reducing the level of emissions that can pass through the EMI shield 154 and adversely affect neighboring semiconductor devices. Similarly, when electromagnetic emissions from a neighboring semiconductor device strike the EMI shield 154, a similar grounding can occur to reduce EMI of the semiconductor device 102 within the package 100. During operation, the package 100 can be disposed on a printed circuit board ("PCB") and electrically connected to the PCB through the electrical contacts 144a and 144b. As previously described, the electrical contact 144b is a ground electrical contact, and the ground electrical contact 144b can be electrically connected to a ground voltage provided by the PCB. Grounding of electromagnetic emissions incident upon the EMI shield 154 can occur through an electrical pathway including the electrical interconnect 146b and the ground electrical contact 144b. Because the electrical interconnect 146b also is electrically connected to the ground contact pad 112b of the semiconductor device 102, the electrical interconnect 146b serves the dual functions of reducing EMI and grounding the semiconductor device 102, thereby conserving valuable area within the package 100. However, it is contemplated that a dedicated grounding element for reducing EMI can be included for other implementations. Because the lower end of the EMI shield 154 is substantially aligned with the lower surface 126 of the redistribution unit 124, the lower end also can be electrically connected to a ground voltage provided by the PCB, thereby providing an alternative electrical pathway for grounding undesired electromagnetic emissions.

In the illustrated embodiment, the EMI shield 154 is a conformal shield that is formed as a set of layers or films. Advantageously, the EMI shield 154 can be formed adjacent to and in direct contact with the exterior surfaces of the package body 114 without the use of an adhesive, thereby enhancing reliability and resistance to temperature, humidity, and other environmental conditions. Also, the conformal characteristics of the EMI shield 154 allow similar EMI shields and similar manufacturing operations to be readily applied to semiconductor device packages of different sizes and shapes, thereby reducing manufacturing cost and time to accommodate the different packages. For certain implementations, a thickness of the EMI shield 154 can be in the range of about 1 μm to about 500 μm, such as from about 1 μm to about 100 μm, from about 1 μm to about 50 μm, or from about 1 μm to about 10 μm. Such reduced thickness of the EMI shield 154 allows a reduced overall package size, and is a further advantage of the illustrated embodiment.

Figure 3:
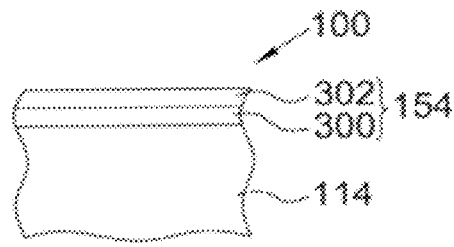
FIG. 3 illustrates an enlarged, cross-sectional view of a portion of the package of FIG. 1.

Attention next turns to FIG. 3, which illustrates an enlarged, cross-sectional view of a portion of the package 100 of FIG. 1 and FIG. 2. In particular, FIG. 3 illustrates a particular implementation of the EMI shield 154 that is disposed adjacent to the package body 114.

As illustrated in FIG. 3, the EMI shield 154 is multi-layered and includes an inner layer 300, which is disposed adjacent to the package body 114, and an outer layer 302, which is disposed adjacent to the inner layer 300 and is exposed at the exterior of the package 100. In general, each of the inner layer 300 and the outer layer 302 can be formed from a metal, a metal alloy, a matrix with a metal or a metal alloy dispersed therein, or another suitable electrically conductive material. For example, at least one of the inner layer 300 and the outer layer 302 can be formed from aluminum, copper, chromium, tin, gold, silver, nickel, stainless steel, or a combination thereof. The inner layer 300 and the outer layer 302 can be formed from the same electrically conductive material or different electrically conductive materials. For example, a metal, such as nickel, can be selected for both the inner layer 300 and the outer layer 302. In some instances, different electrically conductive materials can be selected for the inner layer 300 and the outer layer 302 to provide complementary functionalities. For example, a metal with a higher electrical conductivity, such as aluminum, copper, gold, or silver, can be selected for the inner layer 300 to provide EMI shielding functionality. On the other hand, a metal with a somewhat lower electrical conductivity, such as nickel, can be selected for the outer layer 302 to protect the inner layer 300 against oxidation, humidity, and other environmental conditions. In this case, the outer layer 302 also can contribute to the EMI shielding functionality, while providing the protection functionality. While two layers are illustrated in FIG. 3, it is contemplated that more or less layers can be included for other implementations.

Figure 4:
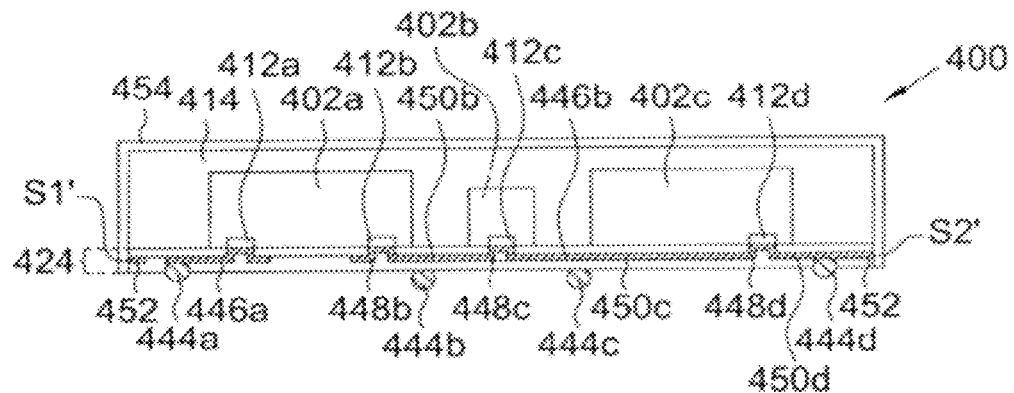
FIG. 4 illustrates a cross-sectional view of a wafer-level semiconductor device package implemented in accordance with another embodiment of the invention.

FIG. 4 illustrates a cross-sectional view of a wafer-level semiconductor device package 400 implemented in accordance with another embodiment of the invention. As illustrated in FIG. 4, the package 400 includes a package body 414, a redistribution unit 424, electrical contacts 444a, 444b, 444c, and 444d, and an EMI shield 454. Certain aspects of the package 400 are implemented in a similar manner as previously described for the package 100 of FIG. 1 through FIG. 3 and, thus, are not further described herein.

Referring to FIG. 4, the package 400 is implemented in a multi-device configuration and includes multiple semiconductor devices 402a, 402b, and 402c. In the illustrated embodiment, the semiconductor devices 402a and 402c are semiconductor chips, while the semiconductor device 402b is a passive device, such as a resistor, a capacitor, or an inductor. While three semiconductor devices are illustrated in FIG. 4, it is contemplated that more or less semiconductor devices can be included for other implementations.

Still referring to FIG. 4, the redistribution unit 424 includes an electrical interconnect 446a, which electrically connects a contact pad 412a of the semiconductor device 402a to the electrical contact 444a, and an electrical interconnect 446b, which electrically connects ground contact pads 412b, 412c, and 412d of the semiconductor devices 402a, 402b, and 402c to the electrical contact 444d, which is a ground electrical contact. More particularly, the electrical interconnect 446b is formed so as to include vias 448b, 448c, and 448d, which are electrically connected to respective ones of the contact pads 412b, 412c, and 412d, an electrical trace 450b, which extends between and electrically connects the vias 448b and 448c, an electrical trace 450c, which extends between and electrically connects the vias 448c and 448d, and an electrical trace 450d, which extends between and electrically connects the via 448d and a grounding portion 452 and also is electrically connected to the ground electrical contact 444d.

In the illustrated embodiment, the grounding portion 452 extends around at least a portion of a periphery of the redistribution unit 424 and, more particularly, is implemented as a grounding ring or a set of grounding strips in accordance with the manufacturing operations as further described below. Referring to FIG. 4, the grounding portion 452 includes connection surfaces S1' and S2', which are lateral surfaces that face away from an interior of the package 400 and are substantially exposed or uncovered at the periphery of the redistribution unit 424. By extending partially or fully around the periphery of the redistribution unit 424, the grounding portion 452 provides relatively large areas for the connection surfaces S1' and S2', which, in turn, provide enhanced reliability and efficiency of electrical connections for reducing EMI. However, it is contemplated that the extent of the grounding portion 452 around the periphery of the redistribution unit 424 can vary for other implementations.

Figure 5:
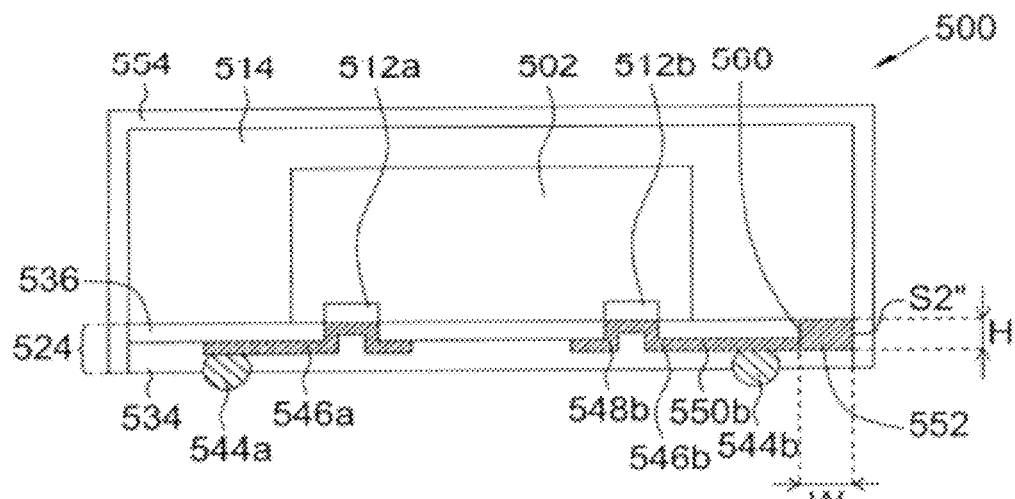
FIG. 5 illustrates a cross-sectional view of a wafer-level semiconductor device package implemented in accordance with another embodiment of the invention.

FIG. 5 illustrates a cross-sectional view of a wafer-level semiconductor device package 500 implemented in accordance with another embodiment of the invention. As illustrated in FIG. 5, the package 500 includes a semiconductor device 502, a package body 514, a redistribution unit 524, electrical contacts 544a and 544b, and an EMI shield 554. Certain aspects of the package 500 are implemented in a similar manner as previously described for the package 100 of FIG. 1 through FIG. 3 and, thus, are not further described herein.

Referring to FIG. 5, the redistribution unit 524 includes an electrical interconnect 546a, which electrically connects a contact pad 512a of the semiconductor device 502 to the electrical contact 544a, and an electrical interconnect 546b, which electrically connects a ground contact pad 512b of the semiconductor device 502 to the electrical contact 544b, which is a ground electrical contact. More particularly, the electrical interconnect 546b is formed so as to include a via 548b, which is electrically connected to the ground contact pad 512b, and an electrical trace 550b, which extends between and electrically connects the via 548b and a grounding portion 552 and also is electrically connected to the ground electrical contact 544b.

In the illustrated embodiment, the grounding portion 552 is implemented as a grounding via and, more particularly, as a remnant of a grounding via in accordance with the manufacturing operations as further described below. The grounding portion 552 is disposed within an opening 560 defined by a dielectric layer 536 of the redistribution unit 524. Referring to FIG. 5, the grounding portion 552 is formed from an electrically conductive material that substantially fills the opening 560, and vertically extends through substantially an entire thickness of the dielectric layer 536. However, it is contemplated that the extent of the grounding portion 552 can be varied for other implementations, and that a grounding ring or a set of grounding strips can be included in place of, or in conjunction with, the grounding portion 552. Still referring to FIG. 5, the grounding portion 552 includes a connection surface S2", which is a lateral surface that faces away from an interior of the package 500 and is substantially exposed or uncovered at the periphery of the redistribution unit 524. Advantageously, the grounding portion 552 provides a relatively large area for the connection surface S2", which, in turn, provides enhanced reliability and efficiency of electrical connections for reducing EMI. For certain implementations, a height H and a width W of the grounding portion 552 each can be in the range of about 2 μm to about 24 μm, such as from about 5 μm to about 15 μm or from about 8 μm to about 12 μm.

Figure 6:
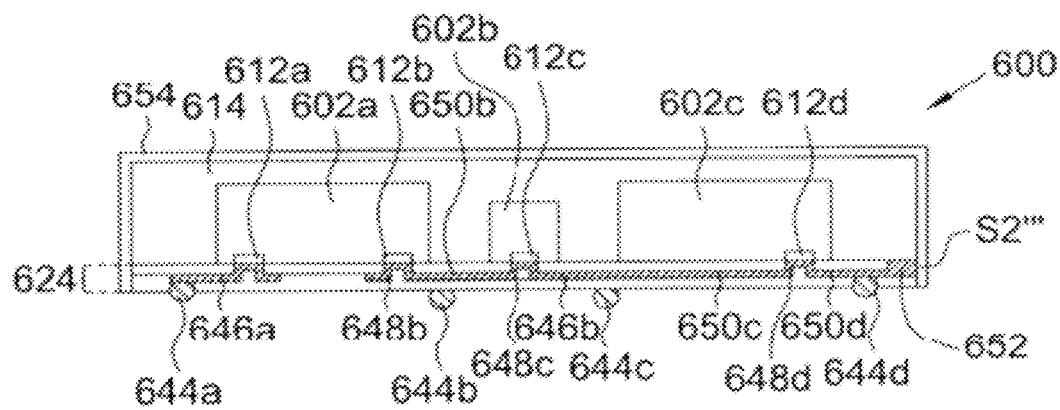
FIG. 6 illustrates a cross-sectional view of a wafer-level semiconductor device package implemented in accordance with another embodiment of the invention.

FIG. 6 illustrates a cross-sectional view of a wafer-level semiconductor device package 600 implemented in accordance with another embodiment of the invention. As illustrated in FIG. 6, the package 600 includes a package body 614, a redistribution unit 624, electrical contacts 644a, 644b, 644c, and 644d, and an EMI shield 654. Certain aspects of the package 600 are implemented in a similar manner as previously described for the package 100 of FIG. 1 through FIG. 3 and the package 500 of FIG. 5 and, thus, are not further described herein.

Referring to FIG. 6, the package 600 is implemented in a multi-device configuration and includes multiple semiconductor devices 602a, 602b, and 602c. In the illustrated embodiment, the semiconductor devices 602a and 602c are semiconductor chips, while the semiconductor device 602b is a passive device, such as a resistor, a capacitor, or an inductor. While three semiconductor devices are illustrated in FIG. 6, it is contemplated that more or less semiconductor devices can be included for other implementations.

Still referring to FIG. 6, the redistribution unit 624 includes an electrical interconnect 646a, which electrically connects a contact pad 612a of the semiconductor device 602a to the electrical contact 644a, and an electrical interconnect 646b, which electrically connects ground contact pads 612b, 612c, and 612d of the semiconductor devices 602a, 602b, and 602c to the electrical contact 644d, which is a ground electrical contact. More particularly, the electrical interconnect 646b is formed so as to include vias 648b, 648c, and 648d, which are electrically connected to respective ones of the ground contact pads 612b, 612c, and 612d, an electrical trace 650b, which extends between and electrically connects the vias 648b and 648c, an electrical trace 650c, which extends between and electrically connects the vias 648c and 648d, and an electrical trace 650d, which extends between and electrically connects the via 648d and a grounding portion 652 and also is electrically connected to the ground electrical contact 644d. In the illustrated embodiment, the grounding portion 652 is implemented as a grounding via and, more particularly, as a remnant of a grounding via in accordance with the manufacturing operations as further described below. Referring to FIG. 6, the grounding portion 652 includes a connection surface S2''', which is a lateral surface that faces away from an interior of the package 600 and is substantially exposed or uncovered at the periphery of the redistribution unit 624. Advantageously, the grounding portion 652 provides a relatively large area for the connection surface S2''', which, in turn, provides enhanced reliability and efficiency of electrical connections for reducing EMI.

FIG. 7A through FIG. 7K illustrate a method of forming a wafer-level semiconductor device package, according to an embodiment of the invention. For ease of presentation, the following manufacturing operations are described with reference to the package 100 of FIG. 1 through FIG. 3. However, it is contemplated that the manufacturing operations can be similarly carried out to form other semiconductor device packages, such as the package 400 of FIG. 4.

Figure 7A:
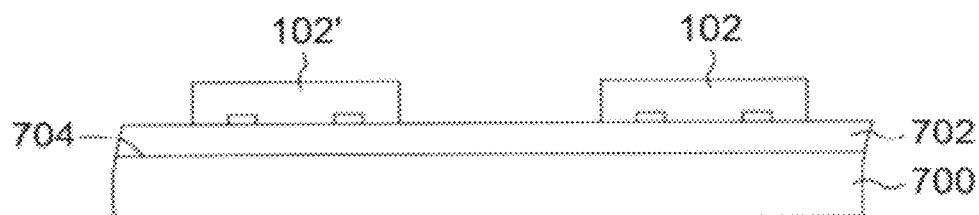
FIG. 7A through FIG. 7K illustrate a method of forming the package of FIG. 1, according to an embodiment of the invention.

Referring first to FIG. 7A, a carrier 700 is provided, and a tape 702 is disposed adjacent to an upper surface 704 of the carrier 700. The tape 702, which can be implemented as a single-sided or double-sided adhesive tape, secures components at an appropriate spacing with respect to one another, and allows subsequent manufacturing operations to be carried out with those components disposed adjacent to the carrier 700.

Once the carrier 700 is provided, multiple semiconductor devices are disposed adjacent to the tape 702, including the semiconductor device 102 and an adjacent semiconductor device 102', thereby allowing certain of the manufacturing operations to be readily performed in parallel or sequentially. The semiconductor devices 102 and 102' are initially included within a wafer at a particular spacing with respect to one another, and the wafer is subjected to singulation to separate the semiconductor devices 102 and 102'. The semiconductor devices 102 and 102', along with any additional semiconductor devices, can be arranged on the tape 702 in an array manner, in which the multiple semiconductor devices are arranged in a two-dimensional fashion, or in a strip manner, in which the multiple semiconductor devices are arranged sequentially in a linear fashion. In the illustrated embodiment, the semiconductor devices 102 and 102' are arranged so as to have a larger nearest-neighbor spacing with respect to one another, relative to their initial nearest-neighbor spacing within the wafer, thereby facilitating a fan-out configuration of resulting packages. However, it is contemplated that the spacing of the semiconductor devices 102 and 102' can be varied for other implementations. For ease of presentation, the following manufacturing operations are primarily described with reference to the semiconductor device 102 and related components, although the manufacturing operations can be similarly carried for other semiconductor devices and related components.

Figure 7B:
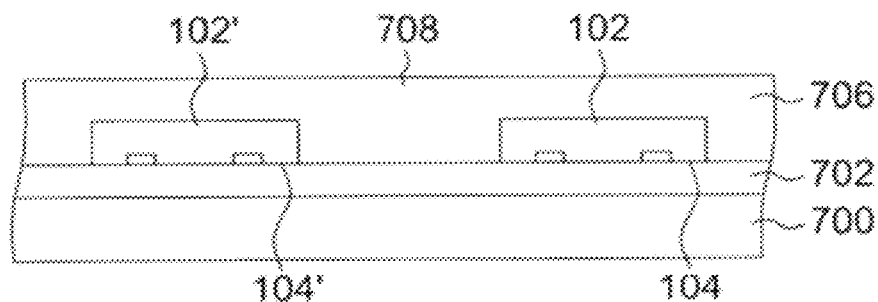

Next, as illustrated in FIG. 7B, a molding material 706 is applied to the carrier 700 so as to substantially cover or encapsulate the semiconductor devices 102 and 102'. Because the semiconductor devices 102 and 102' are arranged on the tape 702, their active surfaces 104 and 104' are substantially uncovered by the molding material 706. The molding material 706 can include, for example, a Novolac-based resin, an epoxy-based resin, a silicone-based resin, or another suitable encapsulant. Suitable fillers also can be included, such as powdered $SiO_2$. The molding material 706 can be applied using any of a number of molding techniques, such as compression molding, injection molding, or transfer molding. Once applied, the molding material 706 is hardened or solidified, such as by lowering the temperature to below a melting point of the molding material 706, thereby forming a molded structure 708. Referring to FIG. 7B, the molded structure 708 along with the encapsulated semiconductor devices 102 and 102' can be referred to as a reconstituted wafer, within which the semiconductor devices 102 and 102' are appropriately spaced with respect to one another to facilitate the fan-out configuration of the resulting packages. To facilitate proper positioning of the molded structure 708 during subsequent singulation operations, fiducial marks can be formed in the molded structure 708, such as using laser marking.

Figure 7C:
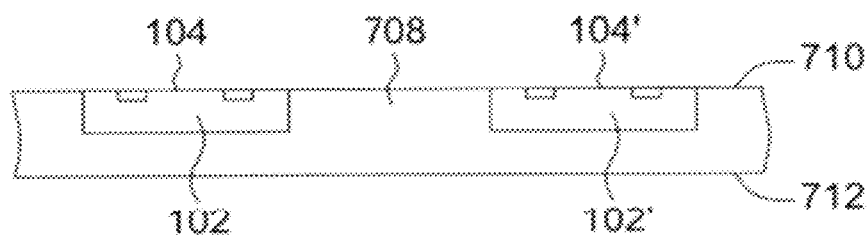

Once the molded structure 708 is formed, the molded structure 708 along with the encapsulated semiconductor devices 102 and 102' are separated from the tape 702, and are reoriented to an upright orientation as illustrated in FIG. 7C. In the illustrated embodiment, an upper surface 710 of the molded structure 708 (in its upright orientation) is substantially aligned or co-planar with the active surfaces 104 and 104' of the semiconductor devices 102 and 102'. While not illustrated in FIG. 7C, it is contemplated that a tape can be used to secure a lower surface 712 of the molded structure 708 (in its upright orientation) to a carrier during subsequent manufacturing operations. The tape can be implemented as a single-sided or double-sided adhesive tape.

Figure 7D:
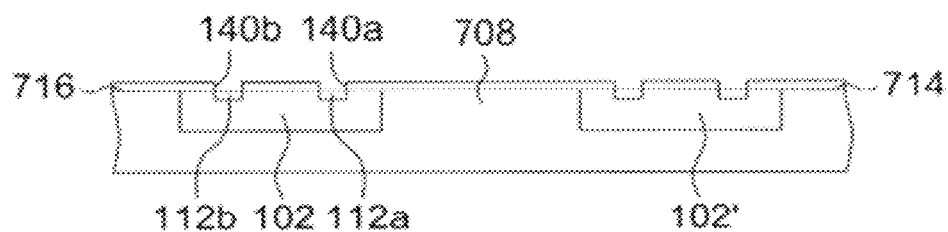

A set of redistribution layers is next formed in situ adjacent to the upper surface 710 of the molded structure 708 and the active surfaces 104 and 104' of the semiconductor devices 102 and 102'. Referring to FIG. 7D, a dielectric material 714 is applied using any of a number of coating techniques, such as printing, spinning, or spraying, and is then patterned to form a dielectric layer 716. As a result of patterning, the dielectric layer 716 is formed with openings that are aligned with the active surfaces 104 and 104', including the openings 140a and 140b that are aligned and sized so as to at least partially expose the contact pads 112a and 112b of the semiconductor device 102. Patterning of the dielectric material 714 can be carried out in any of a number of ways, such as photolithography, chemical etching, laser drilling, or mechanical drilling, and the resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Figure 7E:
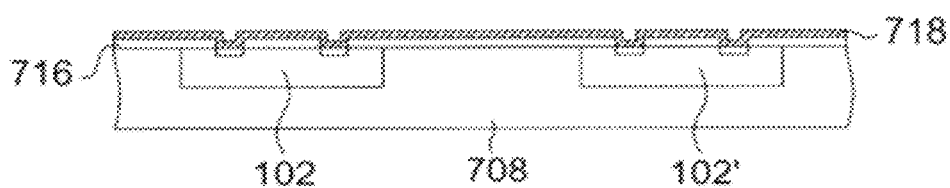
Figure 7F:
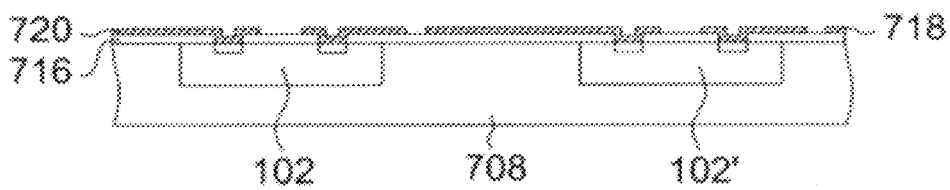

Next, as illustrated in FIG. 7E and FIG. 7F, an electrically conductive material 718 is applied to the dielectric layer 716 and drawn into the openings defined by the dielectric layer 716 using any of a number of coating techniques, such as chemical vapor deposition, electroless plating, electrolytic plating, printing, spinning, spraying, sputtering, or vacuum deposition, and is then patterned to form an electrically conductive layer 720. As a result of patterning, the electrically conductive layer 720 is formed with electrical interconnects that extend along certain portions of the dielectric layer 716 and with gaps between the electrical interconnects that expose other portions of the dielectric layer 716. Patterning of the electrically conductive material 718 can be carried out in any of a number of ways, such as photolithography, chemical etching, laser drilling, or mechanical drilling.

Figure 7G:
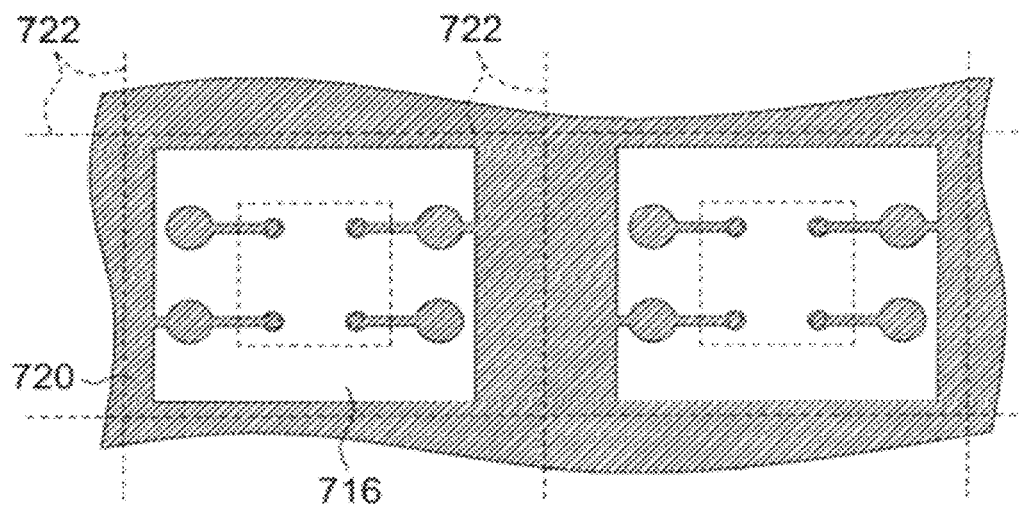
Figure 7H:
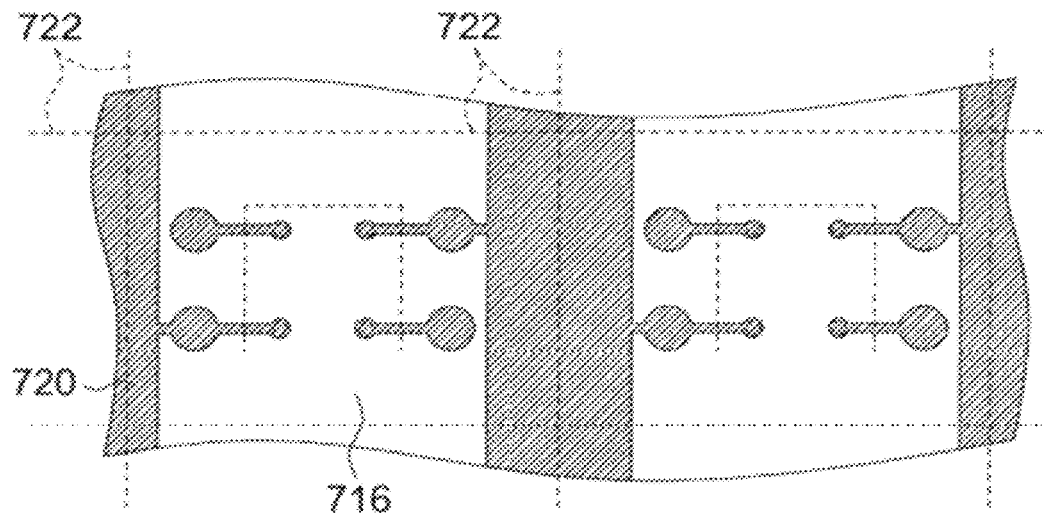

FIG. 7G and FIG. 7H illustrate top views of two implementations of the electrically conductive layer 720 subsequent to patterning. FIG. 7G illustrates a grid-type implementation of the electrically conductive layer 720, which includes one set of substantially parallel strips intersecting another set of substantially parallel strips having a substantially orthogonal orientation, while FIG. 7H illustrates a parallel bars-type implementation of the electrically conductive layer 720, which includes a set of substantially parallel strips. Dashed lines 722 illustrated in FIG. 7G and FIG. 7H represent the orientation and positioning of cutting slits to be formed in accordance with subsequent singulation operations. It should be recognized that the particular implementations of the electrically conductive layer 720 illustrated in FIG. 7G and FIG. 7H are provided by way of example, and various other implementations are contemplated.

Figure 7I:
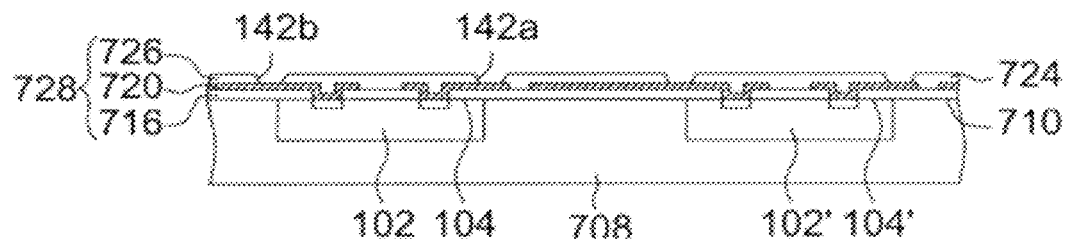

Referring next to FIG. 7I, a dielectric material 724 is applied to the electrically conductive layer 720 and the exposed portions of the dielectric layer 716 using any of a number of coating techniques, such as printing, spinning, or spraying, and is then patterned to form a dielectric layer 726. As a result of patterning, the dielectric layer 726 is formed with openings that are aligned with the electrically conductive layer 720, including the openings 142a and 142b that are aligned so as to at least partially expose the electrically conductive layer 720 and are sized so as to accommodate solder bumps. Patterning of the dielectric material 724 can be carried out in any of a number of ways, such as photolithography, chemical etching, laser drilling, or mechanical drilling, and the resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured. Referring to FIG. 7I, the dielectric layer 726 along with the electrically conductive layer 720 and the dielectric layer 716 can be referred to as a redistribution structure 728, which is disposed adjacent to and extends along the upper surface 710 of the molded structure 708 and the active surfaces 104 and 104' of the semiconductor devices 102 and 102'.

Figure 7J:
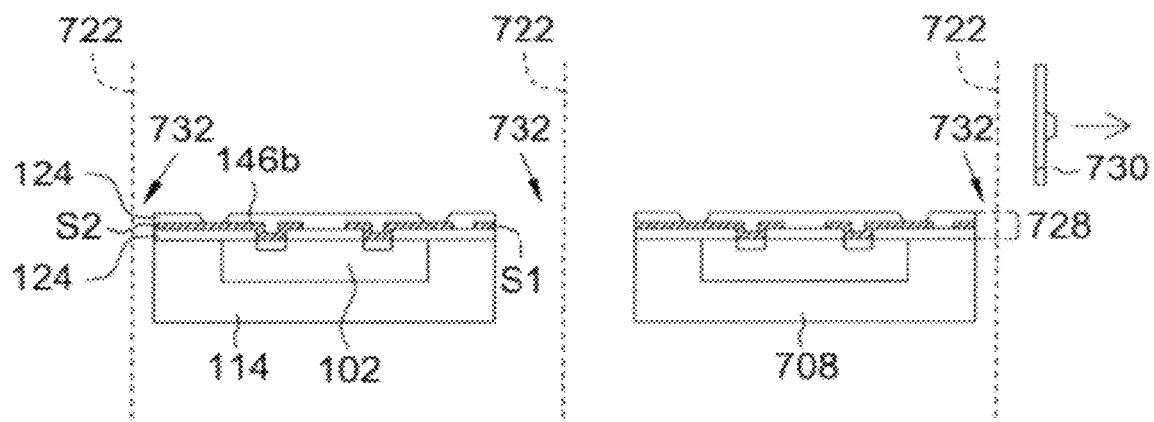

Singulation is next carried out along the dashed lines 722, as illustrated in FIG. 7J. In the illustrated embodiment, singulation is carried out using a saw 730, which forms cutting slits 732. The alignment of the saw 730 during singulation can be aided by fiducial marks, which allow proper positioning of the saw 730 when forming the cutting slits 732. In particular, the cutting slits 732 extend completely through the molded structure 708 and the redistribution structure 728, thereby sub-dividing the molded structure 708 and the redistribution structure 728 into discrete units, including the package body 114 and the redistribution unit 124. Still referring to FIG. 7J, the saw 730 is laterally positioned and aligned with the redistribution structure 728, such that the electrical interconnect 146b is formed to serve as a grounding element, and the connection surfaces S1 and S2 are exposed to the surroundings at the periphery of the redistribution unit 124. In the case of the grid-type implementation of FIG. 7G, the connection surfaces S1 and S2 are lateral surfaces of a grounding ring, and, in the case of the parallel bars-type implementation of FIG. 7H, the connection surfaces S1 and S2 are lateral surfaces of respective grounding strips.

Figure 7K:
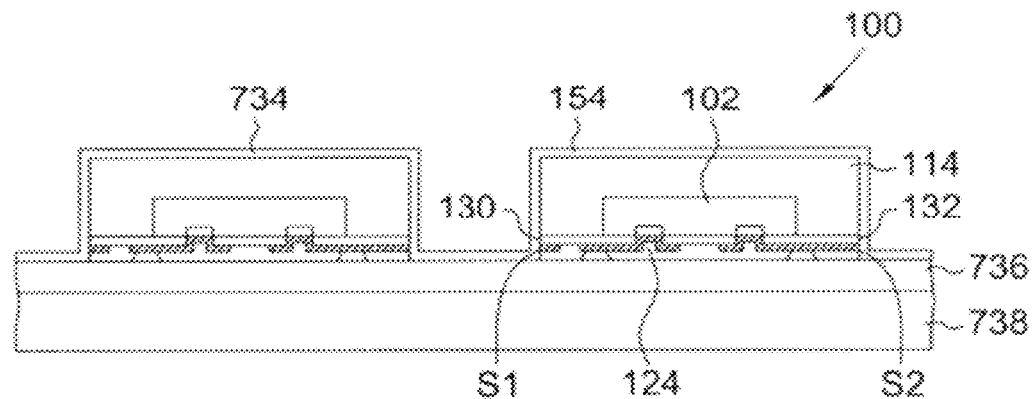

Next, as illustrated in FIG. 7K, an EMI coating 734 is formed adjacent to exposed surfaces, including the exterior surfaces of the package body 114, the connection surfaces S1 and S2 and the lateral surfaces 130 and 132 of the redistribution unit 124. The EMI coating 734 can be formed using any of a number of coating techniques, such as chemical vapor deposition, electroless plating, electrolytic plating, printing, spraying, sputtering, or vacuum deposition. For example, the EMI coating 734 can include a single layer that is formed from nickel using electroless plating and with a thickness of at least about 5 µm, such as from about 5 µm to about 50 µm or from about 5 µm to about 10 µm. If the EMI coating 734 is multi-layered, different layers can be formed using the same coating technique or different coating techniques. For example, an inner layer can be formed from copper using electroless plating, and an outer layer can be formed from nickel using either electroless plating or electrolytic plating. As another example, an inner layer (serving as a base layer) can be formed from copper using either sputtering or electroless plating and with a thickness of at least about 1 µm, such as from about 1 µm to about 50 µm or from about 1 µm to about 10 µm, and an outer layer (serving as an anti-oxidation layer) can be formed from stainless steel, nickel, or copper using sputtering and with a thickness no greater than about 1 µm, such as from about 0.01 µm to about 1 µm or from about 0.01 µm to about 0.1 µm. In these examples, surfaces to which the EMI coating 734 is applied can be subjected to certain pre-treatment operations to facilitate formation of the inner layer and the outer layer. Examples of such pre-treatment operations include surface roughening, such as by chemical etching or mechanical abrasion, and formation of a seed layer. Separating the redistribution unit 124 and related components from a tape 736 and a carrier 738, such as using a pick-and-place technique, results in the package 100 including the EMI shield 154.

Figure 8A:
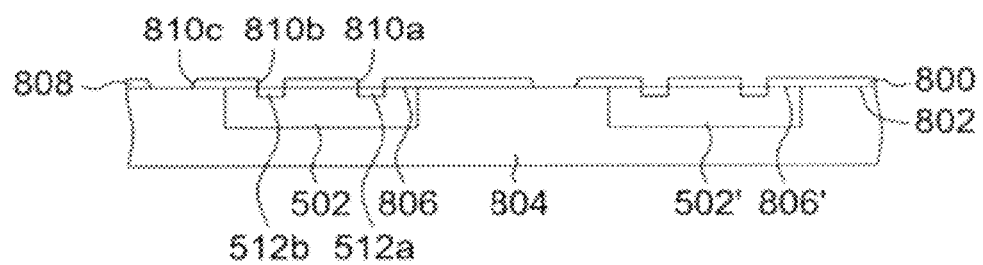
FIG. 8A and FIG. 8B illustrate a method of forming the package of FIG. 5, according to another embodiment of the invention.
Figure 8B:
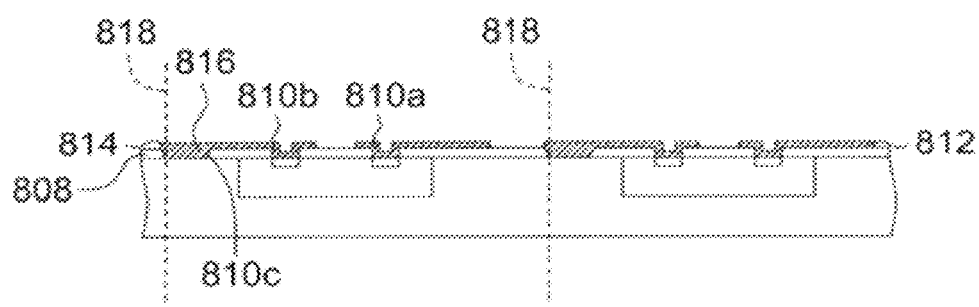

FIG. 8A and FIG. 8B illustrate a method of forming a wafer-level semiconductor device package, according to another embodiment of the invention. For ease of presentation, the following manufacturing operations are described with reference to the package 500 of FIG. 5. However, it is contemplated that the manufacturing operations can be similarly carried out to form other semiconductor device packages, such as the package 600 of FIG. 6. Also, certain aspects of the manufacturing operations are implemented in a similar manner as previously described for FIG. 7A through FIG. 7K and, thus, are not further described herein.

Referring to FIG. 8A, a dielectric material 800 is applied to an upper surface 802 of a molded structure 804 and active surfaces 806 and 806' of the semiconductor device 502 and an adjacent semiconductor device 502', and is then patterned to form a dielectric layer 808. As a result of patterning, the dielectric layer 808 is formed with openings that are aligned with the active surfaces 806 and 806', including the openings 810a and 810b that are aligned and sized so as to at least partially expose the contact pads 512a and 512b of the semiconductor device 502. In the illustrated embodiment, the dielectric layer 808 also is formed with openings that are disposed between adjacent semiconductor devices, including the opening 810c. The openings 810a, 810b, and 810c can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the openings 810a, 810b, and 810c can be curved or roughly textured.

Next, as illustrated in FIG. 8B, an electrically conductive material 812 is applied to the dielectric layer 808 and drawn into the openings 810a, 810b, and 810c defined by the dielectric layer 808, and is then patterned to form an electrically conductive layer 814. As a result of patterning, the electrically conductive layer 814 is formed with electrical interconnects that extend along certain portions of the dielectric layer 808 and with gaps between the electrical interconnects that expose other portions of the dielectric layer 808. In the illustrated embodiment, the electrically conductive material 812 is drawn into the opening 810c so as to substantially fill the opening 810c, thereby resulting in a grounding via 816. Filling the opening 810c yields a larger area for a resulting connection surface, thereby enhancing reliability and efficiency of electrical connections for reducing EMI. Still referring to FIG. 8B, singulation is subsequently carried out along dashed lines 818, such that a resulting cutting slit removes a certain portion of the grounding via 816 and results in a grounding element with an exposed connection surface.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a die having an active surface;
   a package body encapsulating die, the package body including an upper surface, a lower surface, and lateral surfaces disposed adjacent to a periphery of the package body, the lower surface of the package body and the active surface of the die defining a front surface;
   a redistribution layer disposed on the front surface, the redistribution layer including lateral surfaces disposed adjacent to a periphery of the redistribution layer and a grounding element, the grounding element including a connection surface that is electrically exposed adjacent to at least one of the lateral surfaces of the redistribution layer; and
   an electromagnetic interference shield disposed adjacent to the upper surface of the package body and the lateral surfaces of the package body, and extending along at least one of the lateral surfaces of the redistribution layer for electrical connection to the connection surface of the grounding element;
   wherein the grounding element provides an electrical pathway to ground electromagnetic emissions incident upon the electromagnetic interference shield.

2. The semiconductor package of claim 1, wherein the grounding element extends between a contact pad disposed adjacent to the active surface of the die and the electromagnetic interference shield.

3. The semiconductor package of claim 2, wherein the redistribution layer includes a lower surface facing away from the die, the semiconductor package further comprises a ground electrical contact disposed adjacent to the lower surface of the redistribution layer, and the grounding element is electrically connected to the ground electrical contact.

4. The semiconductor package of claim 3, wherein the ground electrical contact is laterally disposed outside of a periphery of the die.

5. The semiconductor package of claim 1, wherein the grounding element includes a first portion and a second portion, the first portion is electrically connected to a contact pad of the die, and the second portion is disposed adjacent to the periphery of the redistribution layer and includes the connection surface.

6. The semiconductor package of claim 5, wherein the second portion is selected from the group consisting of a grounding ring, a grounding strip, and a remnant of a grounding via.

7. The semiconductor package of claim 1, wherein the electromagnetic interference shield includes a lateral portion that extends along the lateral surfaces of the redistribution layer.

8. The semiconductor package of claim 7, wherein the redistribution layer includes a lower surface, and a lower end of the lateral portion is substantially coplanar with the lower surface of the redistribution layer.

9. The semiconductor package of claim 1, wherein the lateral surfaces of the package body are substantially coplanar with respective ones of the lateral surfaces of the redistribution layer.

10. A semiconductor package, comprising:
    a die including an active surface;
    a package body covering the die such that the active surface of the die is electrically exposed;
    a redistribution layer including:
       a dielectric disposed adjacent to the active surface of the die and defining openings that are aligned with portions of the active surface of the die;
       an electrical trace extending along the dielectric and electrically connected to the active surface of the die through one of the openings defined by the dielectric; and a grounding element extending along the dielectric from the active surface of the die to a periphery of the redistribution layer, the grounding element including a lateral surface disposed adjacent to the periphery of the redistribution layer; and an electromagnetic interference shield disposed adjacent to the exterior surfaces of the package body and electrically connected to the lateral surface of the grounding element, wherein the grounding element provides a common electrical pathway to ground electromagnetic emissions incident upon the electromagnetic interference shield and to ground the die.

11. The semiconductor package of claim 10, wherein the grounding element includes a portion that is disposed adjacent to the periphery of the redistribution layer and includes the lateral surface, and the portion is selected from the group consisting of a grounding ring, a grounding strip, and a remnant of a grounding via.

12. The semiconductor package of claim 10, wherein the grounding element is electrically connected to the active surface of the die through another one of the openings defined by the dielectric.

13. The semiconductor package of claim 10, wherein the redistribution layer includes a lower surface, and a lower end of the electromagnetic interference shield is substantially coplanar with the lower surface of the redistribution layer.

14. The semiconductor package of claim 10, wherein the electromagnetic interference shield includes a first layer and a second layer disposed adjacent to the first layer, wherein the first layer and the second layer include different electrically conductive materials.

15. The semiconductor package of claim 10, wherein:
the grounding element is electrically connected to the die; and
at least a portion of the grounding element corresponds to a remnant of a grounding via and includes the lateral surface.

16. The semiconductor package of claim 10, further comprising an electrical contact disposed outside of a periphery of the die, wherein:
the redistribution layer is disposed between the package body and the electrical contact; and
the grounding element is electrically connected to the electrical contact.

17. The semiconductor package of claim 10, wherein a lateral surface of the package body is substantially coplanar with the lateral surface of the grounding element.

18. A semiconductor package, comprising:
a die;
a molded structure encapsulating the die;
a redistribution layer disposed adjacent to the die and the molded structure, wherein a top surface of the redistribution layer is substantially coplanar with a bottom surface of the die, and wherein the redistribution layer includes a grounding portion, the grounding portion disposed adjacent to a periphery of the redistribution layer and outside of a lateral periphery of the die; and
a shield covering an external periphery of the molded structure, wherein the shield extends from the external periphery of the molded structure to the grounding portion, the redistribution layer includes a lower surface, and a lower end of the shield is substantially coplanar with the lower surface of the redistribution layer.

19. The semiconductor package of claim 18, wherein the grounding portion extends from an electrical contact included in the die to the shield.

20. The semiconductor package of claim 18, wherein:
the grounding portion is electrically connected to the die; and
at least a portion of the grounding portion corresponds to a remnant of a grounding via, wherein the remnant has a surface that is exposed at the periphery of the redistribution layer.

21. The semiconductor package of claim 18, wherein a surface of the molded structure is substantially coplanar with a surface of the grounding portion.

22. The semiconductor package of claim 18, further comprising an electrical contact disposed outside of the lateral periphery of the die, wherein:
the redistribution layer is disposed between the molded structure and the electrical contact; and
the grounding portion is electrically connected to the electrical contact.

23. The semiconductor package of claim 22, wherein the grounding portion is electrically connected to the die.

24. The semiconductor package of claim 18, wherein the shield includes a first layer and a second layer disposed adjacent to the first layer, wherein the first layer and the second layer include different electrically conductive materials.

25. The semiconductor package of claim 18, wherein lateral surfaces of the molded structure are substantially coplanar with respective ones of the lateral surfaces of the redistribution layer.

* * * * *